(12) United States Patent
An

(10) Patent No.: US 7,242,559 B2
(45) Date of Patent: Jul. 10, 2007

(54) HIGH VOLTAGE TOLERANT I/O CIRCUIT

(75) Inventor: Chi-Di An, Hsin-Chu (TW)

(73) Assignee: Taiwan Semiconductor Co., Ltd., Hsin-Chu (TW)

( * ) Notice: Subject to any disclaimer, the term of this patent is extended or adjusted under 35 U.S.C. 154(b) by 142 days.

(21) Appl. No.: 10/898,462

(22) Filed: Jul. 22, 2004

(65) Prior Publication Data
US 2006/0018064 A1 Jan. 26, 2006

(51) Int. Cl.
*H02H 9/00* (2006.01)
(52) U.S. Cl. ........................................ 361/56
(58) Field of Classification Search ............. 361/111, 361/113, 56
See application file for complete search history.

(56) References Cited
U.S. PATENT DOCUMENTS
5,495,185 A 2/1996 Goto .................... 326/81

| 5,631,793 A | 5/1997 | Ker et al. ............. 361/56 |
| 5,864,243 A | 1/1999 | Chen et al. ........... 326/58 |
| 6,034,552 A | 3/2000 | Chang et al. .......... 326/83 |
| 6,078,487 A * | 6/2000 | Partovi et al. ......... 361/56 |

* cited by examiner

*Primary Examiner*—Stephen W. Jackson
*Assistant Examiner*—Lucy Thomas
(74) *Attorney, Agent, or Firm*—Duane Morris LLP

(57) ABSTRACT

An I/O circuit is disclosed for tolerating a high voltage input without incurring a leakage current. An ESD current bypass module is coupled between a power supply node and a circuit pad. A high voltage tolerant charge module is used for disabling the ESD current bypass module when the circuit pad receives a high voltage input that is higher than a voltage at the power supply node. In addition, a high voltage tolerant discharge module may be included for alleviating the ESD current bypass module from a voltage overstress when the circuit pad receives a low voltage input that is lower than the voltage at the power supply node.

16 Claims, 2 Drawing Sheets

HIGH VOLTAGE TOLERANT I/O CIRCUIT

BACKGROUND

The present invention generally relates to an input/output (I/O) circuit, and more particularly to an ElectroStatic Discharge (ESD) current bypass module in an I/O circuit that tolerates a high voltage input.

FIG. 1 illustrates a conventional ESD current bypass circuit 10. A pad 11 is electrically connected to an internal circuit 12 via a node 16. A first diode 14 is connected between the node 16 and an I/O power supply 13 having a reference voltage Vdd. A second diode 15 is connected between ground and the node 16. The first diode 14 and second diode 15 clamp the voltage level between the pad 11 and the internal circuit 12 to a certain range. In a normal operation mode, an input signal that falls in this voltage range travels directly from the pad 11 to the internal circuit 12. In an ESD event, an ESD current input from the pad 11 would have a voltage level exceeding the clamped voltage range, and dissipate via the first diode 14 to the I/O power supply 13 or via the second diode 15 to ground. Thus, the internal circuit 12 is protected from such high voltage input due to the ESD event.

One problem of the conventional ESD current bypass circuit 10 is that it cannot operate normally when an operational signal input from the pad 11 has a voltage level Vpad higher than Vdd. If Vpad is higher than Vdd, the first diode 14 will be forward biased and a leakage current will occur between the node 16 and the I/O power supply 13. This would cause Vpad dropping to a lower voltage level, and therefore distort the input signal. As it happens often that high voltage devices and low voltage devices are used in the same integrated circuit, the low voltage devices may be exposed to high voltage signals. The low voltage device may not accommodate the high voltage signals. As such, the problems of leakage current and signal distortion become increasingly troublesome.

FIG. 2 illustrates another conventional ESD current bypass circuit 20. A pad 21 is connected to an internal circuit 24 via a node 30. A PMOS transistor 22 is connected between the node 30 and an I/O power supply 29 having a voltage Vdd. A PMOS transistor 25 is connected between the I/O power supply 29 and the gate of the PMOS transistor 22. A PMOS transistor 26 that is used as a capacitor is connected between the I/O power supply 29 and ground via a resistor RP. An NMOS transistor 23 is connected between the node 30 and ground. An NMOS transistor 27 is connected between ground and the gate of the transistor 23. An NMOs transistor 28 that is used as a capacitor is connected between ground and Vdd via a resistor RN.

The conventional ESD current bypass circuit 20 also has the problems of leakage current and signal distortion, when an operational signal input from the pad 21 has a voltage level Vpad higher than Vdd. For example, assuming Vpad is 5.0 V and Vdd is 3.3 V, the voltage level on wire pp1 is 0.0 V as it is connected to ground. Thus, the PMOS transistor 25 conducts, and wire pp2 has a voltage level of 3.3V, the same as Vdd. For the PMOS transistor 22, the voltage difference between its gate and source is −1.7 V (3.3 V–5.0 V) and the voltage difference between the gate and drain is 0.0 V. The PMOS transistor 22 cannot be completely turned off and there would be leakage current between the node 30 and I/O power supply 29. This would distort the 5.0 V signal input from the pad 21.

In addition, the ESD current bypass circuit 20 has the problem of voltage overstress on the gate oxide of the NMOS transistor 23. Since the voltage level of the gate of transistor 23 constantly remains at 0 V, no matter whether the signal input from the pad 21 is a high voltage or low voltage signal. Due to the voltage overstress, the gate oxide may fail over a period of time. This causes potential reliability issues.

What is needed is an ESD bypass I/O circuit that tolerates high voltage signals and is less susceptible to voltage overstress issues.

SUMMARY

An I/O circuit is disclosed for tolerating a high voltage input without incurring a leakage current. An ESD current bypass module is coupled between a power supply node and a circuit pad. A high voltage tolerant charge module is used to prevent the ESD current bypass module from voltage overstress when the circuit pad receives a high voltage input that is higher than a voltage at the power supply node. In addition, a high voltage tolerant discharge module may be included to prevent the ESD current bypass module from leakage when the circuit pad receives a low voltage input that is lower than the voltage at the power supply node.

The disclosed I/O circuit includes the ESD current bypass module to avoid leakage current between the circuit pad and the power supply node. Accordingly, the disclosed I/O circuit provides a robust pin-to-power ESD protection.

DESCRIPTION

The invention discloses an I/O circuit that is able to bypass ESD current, while preventing a leakage current and getting rid of voltage overstress issues. The I/O circuit employs an ESD current bypass module for pin-to-power ESD protection. A charge module is used to charge the ESD current bypass module to ensure that no voltage overstress would occur, when a high voltage I/O signal is input from a pad into the I/O circuit. When a low voltage I/O signal is input from the pad into the I/O circuit, a discharge module is used to disable the ESD current bypass module to prevent the ESD current bypass module from conduction. The invention is described in detail in the following embodiments.

Figure 2:
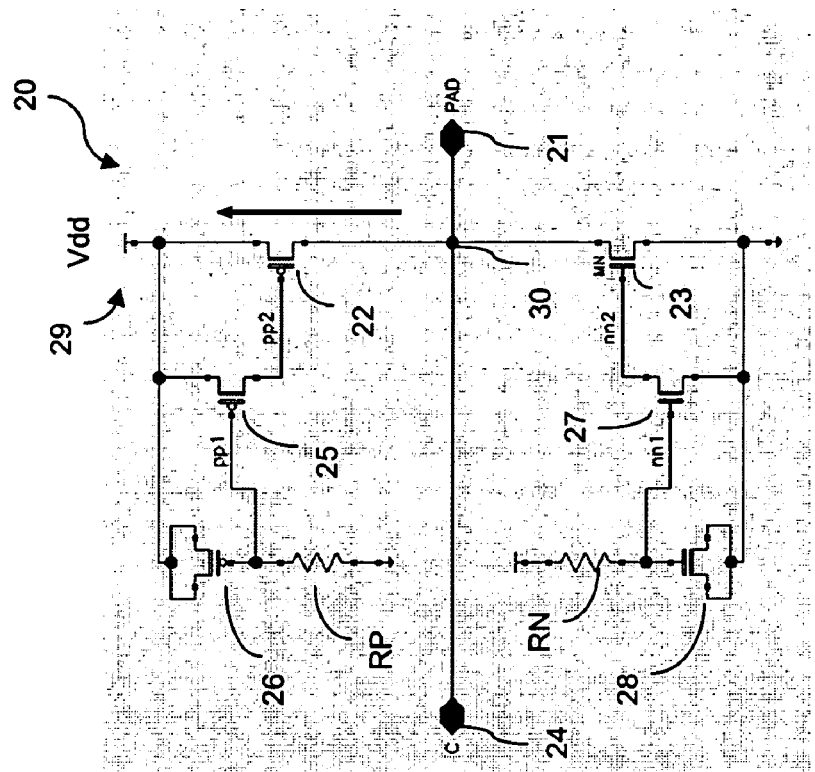
FIG. 2 schematically illustrates another conventional ESD bypass circuit.
Figure 1:
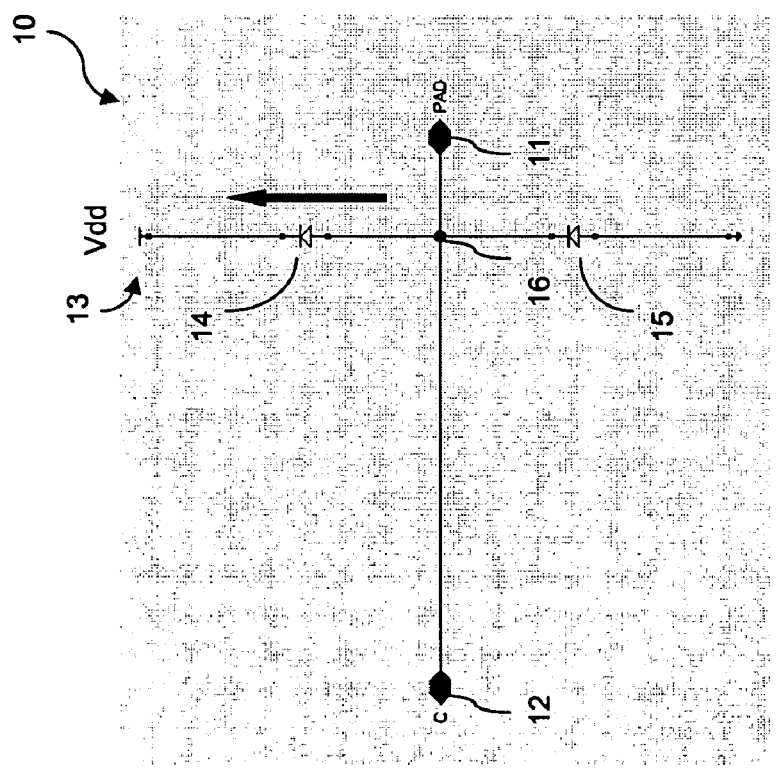
FIG. 1 schematically illustrates an conventional ESD bypass circuit.
Figure 3:
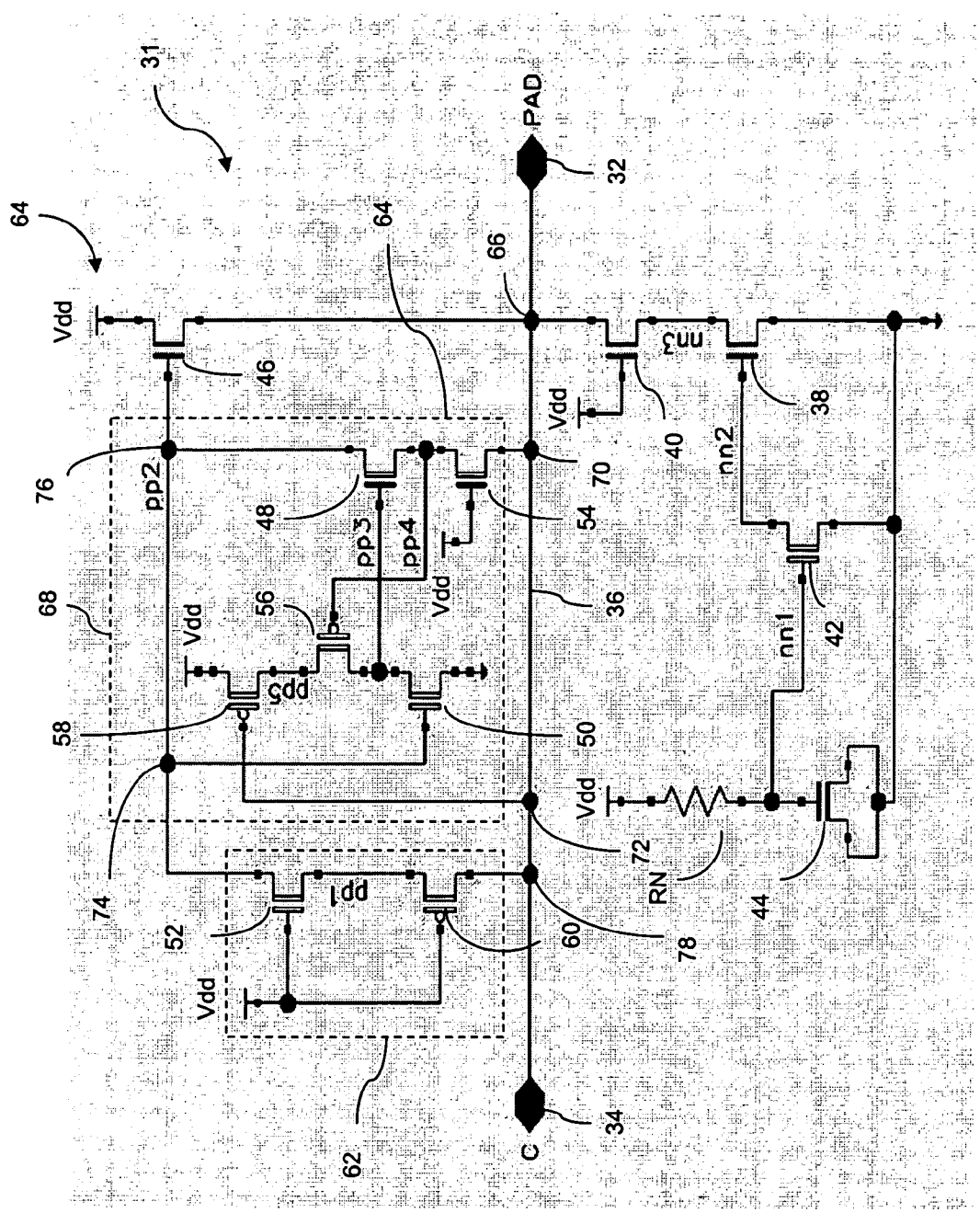
FIG. 3 schematically illustrates a high voltage tolerant I/O circuit, according to an embodiment of the present invention.

FIG. 3 illustrates an I/O circuit 31 according to an embodiment of the present invention. A pad 32 is connected to an internal circuit node 34. NMOS transistors 40 and 38 are connected in series between a node 66 and ground, wherein the gate of NMOS transistor 40 is connected to Vdd. An NMOS transistor 42 is connected between the gate of the transistor 38 and ground. The gate of NMOS transistor 42 is connected to Vdd via a resistor RN. An NMOS transistor 44 that is used as a capacitor is connected to ground with its gate connected to Vdd via the resistor RN.

An ESD current bypass module 46 is connected between the node 66 and an I/O power supply 64 having a reference voltage Vdd. In this embodiment, the ESD current bypass module 46 is an NMOS transistor having its gate connected to a high voltage tolerant discharge module 68 and a high voltage tolerant charge module 62. (It is a normal NMOS) The gate of the ESD current bypass module 46 is floating when the pad 32 is experiencing an ESD event. As such, the gate of the ESD current bypass module 46 would achieve an early breakdown to dissipate an ESD current from the node 66 to the I/O power supply 64.

The discharge module 68 includes NMOS transistors 48, 54 and 50, and PMOS transistors 56 and 58. The NMOS transistor 48 is connected between the gate of the ESD current bypass module 46 and the NMOS transistor 54. The gate of the NMOS transistor 48 is connected to the drain of the NMOS transistor 50 and the PMOS transistor 56. The NMOS transistor 54 is connected between the NMOS transistor 48 and a node 70, with its gate connected to Vdd. The PMOS transistors 58, 56 and NMOS transistor 50 are serially connected between Vdd and ground. The gate of the PMOS transistor 58 is connected to a node 72. The gate of the PMOS transistor 56 is connected to the source of the NMOS transistor 54. The gate of the NMOS transistor 50 is connected to the gate of the ESD current bypass module 46 via nodes 74 and 76.

The high voltage tolerant charge module 62 includes an NMOS transistor 52 and PMOS transistor 60. The NMOS transistor 52 is connected between the gate of the ESD current bypass module 46 and the PMOS transistor 60 that is further connected to a node 78. The gates of the NMOS transistor 52 and the PMOS transistor 60 are connected to Vdd.

The I/O circuit 31 ensures that no high voltage would stress the gate of ESD current bypass module 46 when an operational voltage Vpad input from the pad 32 is higher than Vdd. In such case, the charge module 62 charges the gate of the ESD current bypass module 46 to a sufficient voltage level. In this embodiment, when Vpad is greater than Vdd, the PMOS transistor 60 is turned on because the voltage difference between its gate and source is lower than 0.0 V. The voltage level on wire pp1 is Vpad. The NMOS transistor 52 is always turned on because its gate is connected to Vdd. The voltage level on wire pp2 is Vdd−Vt, where Vt is the threshold voltage of the NMOS transistor 52. Therefore, the voltage difference between the gate and source of the ESD bypass device 46 is −Vt, and the voltage difference between the gate and the drain of the ESD bypass device 46 is Vpad−(Vdd−Vt). As such, the ESD bypass device 46 is completely turned off to prevent a leakage current between the node 66 and the I/O power supply Vdd, and there is no voltage overstress on the gate of the ESD bypass device 46 as long as Vpad<2*Vdd−Vt.

How the charge module 62 disables the ESD current bypass module 46 to prevent a leakage current and get rid of voltage overstress is better understood by the following example. Assuming Vdd is 3.3 V and Vpad is 5.0 V, the electrical potentials on wires PP1, PP2, PP3, PP4, PP5, NN1, NN2 and NN3 are listed in table 1 as the following:

TABLE 1

| | Wire | | | | | | | |
|---|---|---|---|---|---|---|---|---|
| | PP1 | PP2 | PP3 | PP4 | PP5 | NN1 | NN2 | NN3 |
| Voltage | 5 | 3.3-Vt | 0.0 | 3.3-Vt | floating | 3.3 | 0.0 | 3.3-Vt |

The discharge module 68 pulls down a gate voltage of the ESD current bypass module 46, when the voltage level of Vpad is lower than Vdd. Because the gate voltage of ESD current bypass device is 0 V, normally there would not be any leakage current from the I/O power supply Vdd to the node 66.

For example, assuming Vpad is 0.0 V and Vdd remains 3.3 V, the NMOS transistor 54 is turned on and the voltage level on wire pp4 becomes 0.0 V. Because the gate voltage of the PMOS transistor 58 equals to Vpad, which is 0.0 V, it would be turned on and the voltage level on wire pp5 would be Vdd, which is 3.3 V. As the voltage on wire pp4 is 0.0 V, the PMOS transistor 56 is turned on, and the voltage level on wire pp3 equals to that on wire pp5, which is 3.3 V. This turns on the NMOS transistors 48. Because the NMOS transistor 54 is always on, the voltage on wire pp2 becomes Vpad, which is 0.0 V. The voltage levels on wires PP1, PP2, PP3, PP4, PP5, NN1, NN2 and NN3 can be found in table 2 as the following:

TABLE 2

| | Wire | | | | | | | |
|---|---|---|---|---|---|---|---|---|
| | PP1 | PP2 | PP3 | PP4 | PP5 | NN1 | NN2 | NN3 |
| Voltage | 0.0 | 0.0 | 3.3 | 0.0 | 3.3 | 3.3 | 0.0 | 0.0 |

The invention has an advantage of achieving a high voltage tolerant I/O circuit with a single NMOS transistor. When combined with cascade dynamic-floating-gate arrangements, the disclosed I/O circuit can be used as an I/O buffer in an open-drain configuration. The disclosed I/O circuit can also be used simply as a high voltage power supply. In such case, the discharge module 68 would not be necessary and may be optionally removed.

The above invention provides many different embodiments, or examples, for implementing different features of the invention. Specific examples of components, and processes are described to help clarify the invention. These are, of course, merely examples and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. An input/output (I/O) circuit comprising:
   an NMOS transistor based electrostatic discharge (ESD) current bypass module with its source connected to a power supply node and its drain connected to a circuit pad;
   a high voltage tolerant charge module for disabling the ESD current bypass module when the circuit pad receives a voltage input higher than a reference voltage at the power supply node by charging a gate of the transistor to create a voltage difference between the gate and the drain, the high voltage tolerant charge module including a duality of MOS transistors connected in series with their gates coupled to the reference voltage, and
   a high voltage tolerant discharge module for disabling the NMOS transistor of the ESD current bypass module when the circuit pad receives a voltage input lower than the reference voltage,
   a gate of the NMOS transistor of the ESD current bypass module coupled to both the high voltage tolerant charge module and the high voltage tolerant discharge module, the duality of MOS transistors comprising a second NMOS transistor and a third PMOS transistor.

2. The I/O circuit of claim 1 wherein the gate of the NMOS transistor of the ESD current bypass module is floating when the circuit pad is experiencing an ESD event.

3. The I/O circuit of claim 1 wherein the ESD current bypass module is disabled when a predetermined disabling voltage substantially equal to the reference voltage minus a threshold voltage of the transistor, is received at the circuit pad.

4. The I/O circuit of claim 1 wherein the high voltage tolerant charge module and high voltage tolerant discharge module include high voltage tolerant transistors.

5. The I/O circuit of claim 1 wherein a source of the second NMOS transistor is coupled to the gate of the NMOS transistor of the ESD current bypass module and a drain of the PMOS transistor is coupled to the circuit pad.

6. An input/output (I/O) circuit comprising:
an NMOS transistor based electrostatic discharge (ESD) current bypass module with its source connected to a power supply node and its drain connected to a circuit pad; and
a high voltage tolerant discharge module for reducing a voltage at the gate of the NMOS transistor of the ESD current bypass module when the circuit pad receives a voltage input lower than a reference voltage of the power supply node for alleviating the ESD current bypass module from a voltage overstress, the high voltage tolerant discharge module including first and second NMOS transistors connected in series with their gates coupled to the reference voltage and first and second PMOS transistors connected in series.

7. The I/O circuit of claim 6 wherein the gate of the NMOS transistor of the ESD current bypass module is floating when the circuit pad is experiencing an ESD event.

8. The I/O circuit of claim 6 further comprising a high voltage tolerant charge module for disabling the ESD current bypass module when the circuit pad receives a voltage input higher than a voltage at the power supply node by charging a gate of the NMOS transistor of the ESD current bypass module to create a voltage difference between the gate and the source thereof to be lower than zero.

9. An input/output (I/O) circuit for tolerating a high voltage input, the I/O circuit comprising:
an ESD current bypass module coupled between a power supply node and a circuit pad;
a high voltage tolerant charge module for disabling the ESD current bypass module when the circuit pad receives a high voltage input that is higher than a reference voltage at the power supply node; and
a high voltage tolerant discharge module for alleviating the ESD current bypass module from a voltage overstress when the circuit pad receives a low voltage input that is lower than the reference voltage at the power supply node, the high voltage tolerant discharge module including first and second NMOS transistors connected in series with their gates coupled to the reference voltage,
a gate of an NMOS transistor of the ESD current bypass module coupled to both the high voltage tolerant charge module and the high voltage tolerant discharge module.

10. The I/O circuit of claim 9 wherein the NMOS transistor of the ESD current bypass module has its source coupled to the power supply node and its drain coupled to the circuit pad.

11. The I/O circuit of claim 10 wherein the gate of the NMOS transistor of the ESD current bypass module is floating when the circuit pad is experiencing an ESD event.

12. The I/O circuit of claim 10 wherein the gate of the NMOS transistor of the ESD current bypass module is charged to create a voltage difference between the gate and the source thereof to be lower than zero.

13. The I/O circuit of claim 12 wherein the gate of the NMOS transistor of the ESD current bypass module is charged to a predetermined disabling voltage that is substantially equal to the voltage at the power supply node minus a threshold voltage of the transistor.

14. The I/O circuit of claim 10 wherein the high voltage tolerant discharge module reduces a voltage at the gate of the NMOS transistor of the ESD current bypass module to be around zero.

15. The I/O circuit of claim 10 wherein the NMOS transistor of the ESD current bypass module is a high voltage tolerant transistor.

16. The I/O circuit of claim 9 wherein the high voltage tolerant charge module and high voltage tolerant discharge module include high voltage tolerant transistors.

* * * * *

UNITED STATES PATENT AND TRADEMARK OFFICE
CERTIFICATE OF CORRECTION

| | |
|---|---|
| PATENT NO. | : 7,242,559 B2 |
| APPLICATION NO. | : 10/898462 |
| DATED | : July 10, 2007 |
| INVENTOR(S) | : Chi-Di An |

It is certified that error appears in the above-identified patent and that said Letters Patent is hereby corrected as shown below:

(73) Assignee: Delete "Taiwan Semiconductor Co., Ltd.," and insert therefore -- Taiwan Semiconductor Manufacturing Co., Ltd. --.

Column 3, line 60, delete entire "TABLE 1" and insert therefore

--

TABLE 1

| Wire | PP1 | PP2 | PP3 | PP4 | PP5 | NN1 | NN2 | NN3 |
|---|---|---|---|---|---|---|---|---|
| Voltage | 5 | 3.3-Vt | 0.0 | 3.3-Vt | floating | 3.3 | 0.0 | 3.3-Vt |

--

Column 4, line 20, delete entire "TABLE 2" and insert therefore

--

TABLE 2

| Wire | PP1 | PP2 | PP3 | PP4 | PP5 | NN1 | NN2 | NN3 |
|---|---|---|---|---|---|---|---|---|
| Voltage | 0.0 | 0.0 | 3.3 | 0.0 | 3.3 | 3.3 | 0.0 | 0.0 |

--

Signed and Sealed this

Eleventh Day of March, 2008

JON W. DUDAS
*Director of the United States Patent and Trademark Office*